United States Patent
Zhang

(10) Patent No.: US 11,081,530 B2
(45) Date of Patent: Aug. 3, 2021

(54) PIXEL ARRANGEMENT STRUCTURE, DISPLAY PANEL, MASK COMPONENT, AND EVAPORATION APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventor: Yuanqi Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/609,299

(22) PCT Filed: Apr. 12, 2019

(86) PCT No.: PCT/CN2019/082463
§ 371 (c)(1),
(2) Date: Oct. 29, 2019

(87) PCT Pub. No.: WO2019/201170
PCT Pub. Date: Oct. 24, 2019

(65) Prior Publication Data
US 2020/0058713 A1   Feb. 20, 2020

(30) Foreign Application Priority Data

Apr. 17, 2018 (CN) .......................... 201810343974.8

(51) Int. Cl.
*H01L 27/32* (2006.01)
*C23C 14/04* (2006.01)

(52) U.S. Cl.
CPC ........ *H01L 27/3218* (2013.01); *C23C 14/042* (2013.01)

(58) Field of Classification Search
CPC .......................... H01L 27/3218; C23C 14/042
(Continued)

(56) References Cited

U.S. PATENT DOCUMENTS

2009/0073099 A1* 3/2009 Yeates ................. H01L 27/3213
345/88
2009/0243984 A1* 10/2009 Fujinawa .......... G02F 1/133707
345/89
(Continued)

FOREIGN PATENT DOCUMENTS

CN          104330913 A      2/2015
CN          104614933 A      5/2015
(Continued)

*Primary Examiner* — Dzung Tran
(74) *Attorney, Agent, or Firm* — Dilworth & Barrese, LLP.; Michael J. Musella, Esq.

(57) ABSTRACT

A pixel arrangement structure, a display panel, a mask component, and an evaporation apparatus are provided. The pixel arrangement structure includes a plurality of sub-pixels arranged in a row direction and a column direction. The plurality of sub-pixels are divided into a plurality of rows of sub-pixel groups. Each of rows of sub-pixel groups include at least two rows of the sub-pixels, and include a plurality of repeating units arranged in sequence, and each of the repeating units includes at least two sub-pixel groups of different colors. Each of the sub-pixel groups includes at least two sub-pixels of a same color that are located in at least two rows and are adjacently arranged, and sub-pixels adjacent to each other and having different colors, which are located in sub-pixel groups of different colors, constitute one pixel.

14 Claims, 9 Drawing Sheets

(58) Field of Classification Search
USPC .......................................................... 257/79
See application file for complete search history.

(56) References Cited

U.S. PATENT DOCUMENTS

| | | | | |
|---|---|---|---|---|
| 2011/0012820 A1* | 1/2011 | Kim | ..................... | G09G 3/3208 |
| | | | | 345/82 |
| 2015/0015465 A1* | 1/2015 | Gong | ................... | G09G 3/3208 |
| | | | | 345/76 |
| 2015/0021637 A1 | 1/2015 | Ahn et al. | | |
| 2015/0035731 A1* | 2/2015 | Wang | .................. | H01L 27/3218 |
| | | | | 345/76 |
| 2016/0275858 A1* | 9/2016 | Wang | ...................... | H01L 27/32 |
| 2020/0058713 A1 | 2/2020 | Zhang | | |

FOREIGN PATENT DOCUMENTS

| | | |
|---|---|---|
| CN | 106129095 A | 11/2016 |
| CN | 107742637 A | 2/2018 |
| CN | 108493221 A | 9/2018 |
| KR | 1020120041510 A | 5/2020 |

* cited by examiner

PIXEL ARRANGEMENT STRUCTURE, DISPLAY PANEL, MASK COMPONENT, AND EVAPORATION APPARATUS

This application claims priority to Chinese Patent Application No. 201810343974.8, filed on Apr. 17, 2018, the entire disclosure of which is incorporated herein by reference as part of the present application.

TECHNICAL FIELD

At least one embodiment of the present disclosure relates to a pixel arrangement structure, a display panel, a mask component, and an evaporation apparatus.

BACKGROUND

With advances in display technologies, semiconductor component technology, which is a core of a display device, has further made a great progress. For an existing display device, an organic light emitting diode (OLED), which is a current-type light emitting device, is increasingly used in the field of high-performance display due to its characteristics of self-illumination, fast response, wide viewing angle, capability of being manufactured on a flexible substrate, etc.

Currently, a light emitting layer of an OLED device may be formed through an evaporation process by using a mask, such as a fine metal mask (FMM). The size of a light emitting region in one sub-pixel of the OLED display device is determined by the size of an opening in the FMM. However, due to a limitation of manufacturing accuracy of the FMM, the size of the opening on the FMM is difficult to further reduce, thereby restricting further improvement of the resolution of the OLED display device.

SUMMARY

At least one embodiment of the present disclosure provides a pixel arrangement structure. The pixel arrangement structure includes a plurality of sub-pixels, arranged in a row direction and a column direction; and a plurality of rows of sub-pixel groups, each of rows of sub-pixel groups including at least two rows of the sub-pixels, and including a plurality of repeating units arranged in sequence, and each of the repeating units including at least two sub-pixel groups of different colors. Each of the sub-pixel groups includes at least two sub-pixels of a same color that are located in at least two rows and are adjacently arranged, and sub-pixels adjacent to each other and having different colors, which are located in sub-pixel groups of different colors, constitute one pixel.

For example, in the pixel arrangement structure provided by at least one embodiment of the present disclosure, an arrangement of repeating units of sub-pixel groups in odd-numbered rows is identical, and an arrangement of repeating units of sub-pixel groups in even-numbered rows is staggered by at least one of the sub-pixel groups in the row direction, relative to an arrangement of repeating units of sub-pixel groups in adjacent odd-numbered rows.

For example, in the pixel arrangement structure provided by at least one embodiment of the present disclosure, the sub-pixels in each of the sub-pixel groups are arranged in two rows, and the sub-pixels included in the pixel are arranged in two rows.

For example, in the pixel arrangement structure provided by at least one embodiment of the present disclosure, each of the repeating units includes sub-pixels groups of three different colors, and includes two sub-pixel groups of each color of the three different colors, adjacent sub-pixel groups have different colors, and a same sub-pixel group includes three of the sub-pixels, centroids of the sub-pixels in each of the sub-pixel groups are configured to be linked to constitute a first virtual triangle, three sub-pixels of different colors which belong to different sub-pixel groups and are adjacent to each other constitute one pixel, and the sub-pixel groups are arranged in one row, and two of the sub-pixel groups, between which two of the sub-pixel groups are arranged, have a same color.

For example, in the pixel arrangement structure provided by at least one embodiment of the present disclosure, in sub-pixel groups in a same row, arrangements of sub-pixels in adjacent sub-pixel groups are different.

For example, in the pixel arrangement structure provided by at least one embodiment of the present disclosure, in the sub-pixel groups in the same row, vertex angles of first virtual triangles in two of the sub-pixel groups of a same color have opposite directions, and vertex angles of first virtual triangles in two adjacent sub-pixel groups of different colors have opposite directions; and in sub-pixel groups, in a same column, of a same color, vertex angles of first virtual triangles in two adjacent sub-pixel groups have a same direction.

For example, in the pixel arrangement structure provided by at least one embodiment of the present disclosure, a repeating unit includes a first sub-pixel group, a second sub-pixel group, and a third sub-pixel group, which are of different colors, an arrangement order of a first sub-pixel group, a second sub-pixel and a third sub-pixel group in sub-pixel groups in an (i)th row is same with an arrangement order of a first sub-pixel group, a second sub-pixel and a third sub-pixel group in sub-pixel groups in a (i+2)th row; an arrangement position of the first sub-pixel group in the (i)th row and an arrangement position of the first sub-pixel group in the (i+2)th row are staggered, and one column of second sub-pixel groups and one column of third sub-pixel groups are arranged between two adjacent columns of first sub-pixel groups; and i is a positive integer.

For example, in the pixel arrangement structure provided by at least one embodiment of the present disclosure, in a same pixel, centroids of three different sub-pixels are configured to be linked to constitute a second virtual triangle.

For example, in the pixel arrangement structure provided by at least one embodiment of the present disclosure, in pixels in a same row, vertex angles of second virtual triangles in two adjacent pixels have opposite directions; and in pixels in a same column, vertex angles of second virtual triangles in any two of the pixels have a same direction.

For example, in the pixel arrangement structure provided by at least one embodiment of the present disclosure, each of the repeating units includes four sub-pixel groups of different colors, and a same sub-pixel group includes four sub-pixels, centroids of sub-pixels in each of the sub-pixel groups are configured to be linked to constitute a first virtual quadrilateral, and four adjacent sub-pixels of different colors which belong to different sub-pixel groups constitute one pixel.

For example, in the pixel arrangement structure provided by at least one embodiment of the present disclosure, the four sub-pixel groups of different colors include a first sub-pixel group, a second sub-pixel group, a third sub-pixel group, and a fourth sub-pixel group, and the first sub-pixel group, the second sub-pixel group, the third sub-pixel group and the fourth sub-pixel group are arranged in a plurality of rows and a plurality of columns, and adjacent sub-pixel groups are located in a same row or a same column.

For example, in the pixel arrangement structure provided by at least one embodiment of the present disclosure, a sub-pixel group in an (i)th row and a (j)th column has a same color as a sub-pixel group in a (i+1)th row and a (j+2)th column; the sub-pixel group in the (i)th row and the (j)th column has a same color as a sub-pixel group in a (i+2)th row and a (j)th column; and i and j are positive integers.

For example, in the pixel arrangement structure provided by at least one embodiment of the present disclosure, in a same pixel, centroids of four different sub-pixels are configured to be linked to constitute a second virtual quadrilateral.

For example, in the pixel arrangement structure provided by at least one embodiment of the present disclosure, a planar shape of a sub-pixel is one or a combination of a circle, a triangle, a rectangle, and a polygon.

For example, in the pixel arrangement structure provided by at least one embodiment of the present disclosure, the planar shape of the sub-pixel is a regular hexagon or a square.

At least one embodiment of the present disclosure provides a display panel, which includes the pixel arrangement structure provided by any one of the embodiments described above.

At least one embodiment of the present disclosure provides a mask component for manufacturing the pixel arrangement structure according to any one of the embodiments described above. The mask component includes at least one mask provided with a plurality of openings. During evaporation, each of the openings corresponds to one of the sub-pixel groups, and a region where an opening is located covers a region where a sub-pixel group corresponding to the opening is located.

For example, in the mask component provided by at least one embodiment of the present disclosure, all of the openings on the mask correspond to sub-pixel groups of a same color.

For example, in the mask component provided by at least one embodiment of the present disclosure, in a case where the sub-pixel groups include a first sub-pixel group, a second sub-pixel group and a third sub-pixel group which are of different colors, the plurality of openings on the mask include a plurality of first openings and a plurality of second openings; the first openings and the second openings correspond to sub-pixel groups having a same color and having the first virtual triangles with different vertex angle directions, respectively; and a light shielding region between a first opening and a second opening that are adjacent and located in a same row corresponds to sub-pixel groups of other colors.

For example, in the mask component provided by at least one embodiment of the present disclosure, and the at least one mask includes a first mask, a second mask and a third mask; each of openings on the first mask corresponds to one of first sub-pixel groups; each of openings on the second mask corresponds to one of second sub-pixel groups; and each of openings on the third mask corresponds to one of third sub-pixel groups.

For example, in the mask component provided by at least one embodiment of the present disclosure, and the at least one mask includes a first mask, a second mask, a third mask and a fourth mask; each of openings on the first mask corresponds to one of first sub-pixel groups; each of openings on the second mask corresponds to one of second sub-pixel groups; each of openings on the third mask corresponds to one of third sub-pixel groups; and each of openings on the fourth mask corresponds to one of fourth sub-pixel groups.

At least one embodiment of the present disclosure provides an evaporation apparatus. The evaporation apparatus includes the mask component according to any one of the embodiments described above.

For example, the evaporation apparatus provided by at least one embodiment of the present disclosure further includes a mask frame, a plurality of cover masks, and a plurality of howling masks, the cover masks and the howling masks are configured to shield openings on the mask corresponding to a region between two adjacent display panels in a mother board to be evaporated; and one mask in the mask component is fixedly mounted on the mask frame, and the cover masks and the howling masks, which cross each other, are laterally and vertically mounted on the mask frame.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
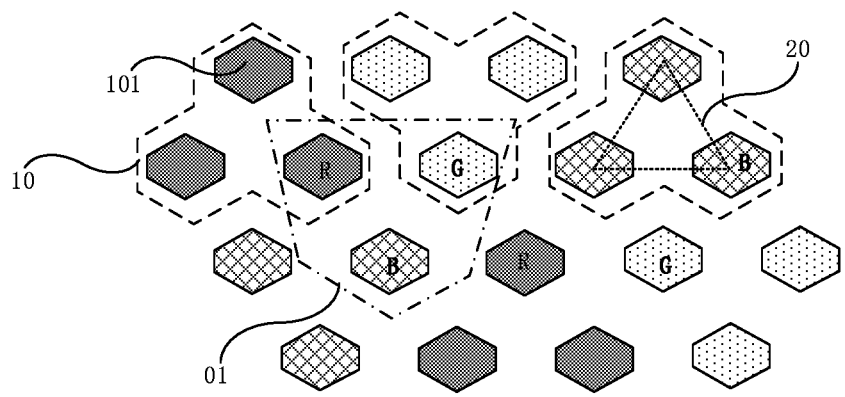
FIG. 1 is a schematic diagram of a pixel arrangement structure provided by some embodiments of the present disclosure.

In order to make objects, technical details and advantages of the embodiments of the present disclosure, the technical solutions of the embodiments will be described in a clearly and fully understandable way in connection with the drawings related to the embodiments of the present disclosure. Apparently, the described embodiments are just a part but not all of the embodiments of the invention. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At least one embodiment of the present disclosure provides a pixel arrangement structure. The pixel arrangement structure includes a plurality of sub-pixels which are arranged in a row direction and a column direction; and a plurality of rows of sub-pixel groups. Each of rows of sub-pixel groups includes at least two rows of the sub-pixels, and includes a plurality of repeating units arranged in sequence, and each of the repeating units includes at least two sub-pixel groups of different colors. Each of the sub-pixel groups includes at least two sub-pixels of a same color that are located in at least two rows and are adjacently arranged, and sub-pixels adjacent to each other and having different colors, which are located in sub-pixel groups of different colors, constitute one pixel. In this pixel arrangement structure, a plurality of sub-pixels in a same sub-pixel group can be formed by using one opening of a mask, and the opening may have a large design size, thereby reducing the requirement for the size of the opening in the mask (the opening doesn't need to be very small), reducing the requirement for an apparatus used in the manufacturing, and lowering costs. In addition, it should be noted that, while the requirement for the size of the opening of the mask is reduced, a plurality of sub-pixels may further be manufactured through one opening of the mask, thereby increasing the count of the sub-pixels, and improving the resolution of a display panel.

Hereinafter, a pixel arrangement structure, a display panel, a mask component and an evaporation apparatus according to at least one embodiment of the present disclosure are described with reference to the accompanying drawings.

Figure 2:
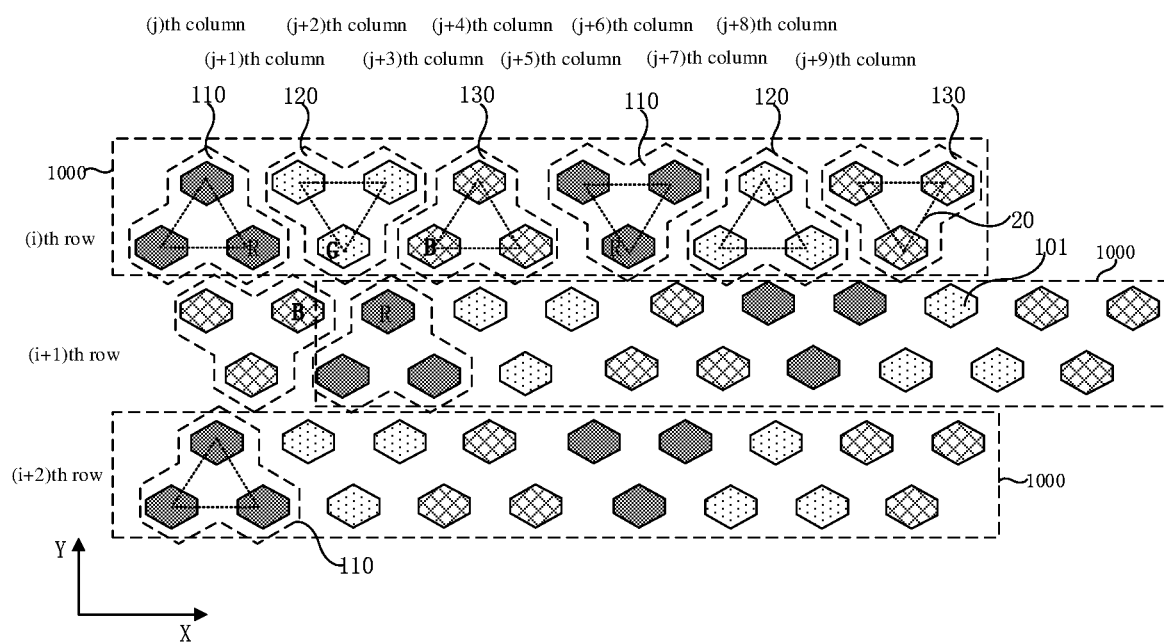
FIG. 2 is a schematic diagram of another pixel arrangement structure provided by some embodiments of the present disclosure.

At least one embodiment of the present disclosure provides a pixel arrangement structure. As illustrated in FIG. 1 and FIG. 2, the pixel arrangement structure includes a plurality of sub-pixels 101 arranged in a row direction and a column direction. At least two rows of the sub-pixels 101 include a plurality of repeating units 1000 arranged sequentially. Each of the repeating units 1000 includes sub-pixel groups 10 of at least two different colors (e.g., three different colors in the drawing). Each of the sub-pixel groups 10 includes at least two sub-pixels 101 of a same color that are located in at least two rows and are adjacently arranged. Sub-pixels 101 adjacent to each other and having different colors, which are located in sub-pixel groups 10 of different colors, constitute one pixel 01. In this way, all of the sub-pixels 101 in a same sub-pixel group 10 are of the same color, so that the sub-pixels 101 can be formed by one pattern (for example, an opening) of the mask. The pixel 01 is formed of sub-pixels of different colors, thereby realizing color display.

For example, in the pixel arrangement structure according to at least one embodiment of the present disclosure, an arrangement of repeating units of sub-pixel groups in odd-numbered rows is identical, and an arrangement of repeating units of sub-pixel groups in even-numbered rows is staggered by at least one of the sub-pixel groups in the row direction, relative to the arrangement of repeating units of sub-pixel groups in adjacent odd-numbered rows. Exemplarily, as illustrated in FIG. 1 and FIG. 2, the repeating unit 1000 in each row (for example, in an (i)th row) includes a first sub-pixel group 110, a second sub-pixel group 120, a third sub-pixel group 130, a first sub-pixel group 110, a second sub-pixel group 120, and a third sub-pixel group 130, which are arranged in sequence in the row direction. The first sub-pixel group 110, the second sub-pixel group 120 and the third sub-pixel group 130 are of different colors. Additionally, the repeating unit 1000 in an (i)th row (for example, the odd-numbered row) and the repeating unit 1000 in a (i+2)th row (for example, the odd-numbered row) are arranged in the same manner, that is, the sub-pixel groups having the same color in the (i)th row and the (i+2)th row are located in the same column. For example, the sub-pixel group located in the (i)th row and a (j)th column and the sub-pixel group located in the (i+2)th row and a (j)th column are first sub-pixel groups 110. The sub-pixel group located in the (i)th row and a (j+2)th column and the sub-pixel group located in the (i+2)th row and a (j+2)th column are second sub-pixel groups 120, and the sub-pixel group located in the (i)th row and a (j+3)th column and the sub-pixel group located in the (i+2)th row and a (j+3)th column are third sub-pixel groups 130. In addition, the arrangement of the repeating unit 1000 in the (i)th row (for example, the odd-numbered row) and the arrangement of the repeating unit 1000 in a (i+1)th row (for example, the even-numbered row) is staggered by one sub-pixel group in the row direction, that is, a difference in the numbers of columns of the sub-pixel groups having the same color in the (i)th row and the (i+1)th row is an odd number. For example, in FIG. 2, the sub-pixel group located in the (i)th row and the (j)th column and the sub-pixel group located in the (i)th row and a (j+6)th column are the first sub-pixel groups 110. The sub-pixel group located in the (i+1)th row and a (j+3)th column and the sub-pixel group located in the (i+1)th row and a (j+9)th column are the first sub-pixel groups 110, and the sub-pixel groups located in the (j)th, the (j+3)th, the (j+6)th and the (j+9)th columns are the first sub-pixel groups 110.

Figure 12:
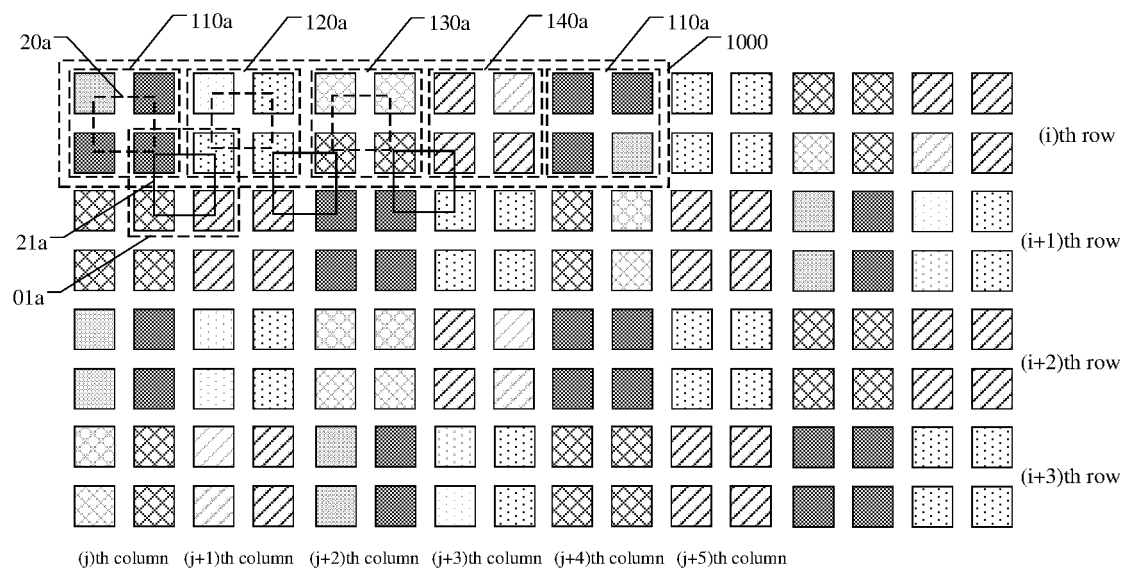
FIG. 12 is a schematic diagram of yet another pixel arrangement structure provided by some embodiments of the present disclosure.

For example, in the pixel arrangement structure according to at least one embodiment of the present disclosure, in the row direction, in each of the repeating units in the same row, the sub-pixel groups of different colors are arranged in a row, of which an arrangement order is the same. Exemplarily, as illustrated in FIG. 1 and FIG. 2, in all of the repeating units 1000 in the same row (for example, in the (i)th row), in the row direction, a red sub-pixel group (represented by R), a green sub-pixel group (represented by G) and a blue sub-pixel group (represented by B) in each of the repeating units 1000 are arranged in sequence. Exemplarily, as illustrated in FIG. 12, in all of the repeating units 1000 in the same row (for example, in the (i)th row), in the row direction, a first sub-pixel group 110a (for example, is red), a second sub-pixel group 120a (for example, is green), a third sub-pixel group 130a (for example, is blue) and a fourth sub-pixel group 140a (for example, is white) in each of the repeating units 1000 are arranged in sequence. In this way, the arrangement of the sub-pixel groups (or the sub-pixels therein) may be simplified, the design difficulty of the pixel arrangement structure may be lowered, the manufacturing process of the pixel arrangement structure may be simplified, and the cost may be reduced.

For example, in the pixel arrangement structure according to at least one embodiment of the present disclosure, the sub-pixels in each of the sub-pixel groups are arranged in two rows, and the sub-pixels included in the pixel are arranged in two rows. Exemplarily, as illustrated in FIG. 1 and FIG. 2, the sub-pixels 101 in each of the sub-pixel groups 10 are arranged in two rows. In this way, the sub-pixels 101, located in two rows, of the sub-pixel groups 10 may constitute pixels 01 respectively together with the sub-pixels 101 in the sub-pixel groups 10 in other rows. For example, in the sub-pixel groups 10 in the (i+1)th row, sub-pixels 101 in one row and the sub-pixels in the sub-pixel groups 10 in the (i)th row constitute one pixel 01, and sub-pixels 101 in another row and the sub-pixels in the sub-pixel groups 10 in the (i+2)th row constitute another pixel 01.

In the embodiments of the present disclosure, the count of types of color of the sub-pixel groups and the count of the sub-pixels therein are not limited. For example, the count of the types of color of the sub-pixel groups are equal to the count of the sub-pixels in each of the sub-pixel groups. For example, the sub-pixel groups may be of three colors, four colors or more colors. The count of colors of the sub-pixel groups as well as specific colors of the sub-pixel groups (e.g., red, green, blue, etc.) may be selected based on a combination of color display.

For example, in some embodiments of the present disclosure, each of the repeating units of the pixel arrangement structure includes sub-pixel groups of three different colors (for example, three sub-pixel groups). The count of the sub-pixel groups of each color is two, that is, each of the repeating units includes six sub-pixel groups. Each of the sub-pixel groups includes three sub-pixels. For example, in some other embodiments of the present disclosure, each of the repeating units of the pixel arrangement structure includes sub-pixel groups of four colors (e.g., four sub-pixel groups), and each of the sub-pixel groups includes four sub-pixels. Hereinafter, the pixel arrangement structure, the display panel, the mask component, and the evaporation apparatus in at least one embodiment of the present disclosure are described according to the pixel arrangement structure of the two structures described above.

For example, in the pixel arrangement structure according to at least one embodiment of the present disclosure, as illustrated in FIG. 1, each of the repeating units 1000 of the pixel arrangement structure includes sub-pixel groups 10 of three different colors. Each of the sub-pixel groups 10 includes three sub-pixels 101 of the same color, and centroids of the three sub-pixels 101 in the same sub-pixel group 10 are configured to be linked to constitute a first virtual triangle 20. For example, in a case where the sub-pixel 101 has a regular shape, the centroid may be its center.

For example, in the pixel arrangement structure according to at least one embodiment of the present disclosure, three sub-pixels 101 which belong to different sub-pixel groups 10 and are adjacent to each other constitute one pixel 01. Therefore, the pixel arrangement structure has a plurality of pixels 01 described above, thereby providing different data signals for each of the sub-pixels 101 in different pixels 01 to realize display of gray scale pictures.

For example, in the pixel arrangement structure according to at least one embodiment of the present disclosure, in the case where each of the repeating units includes the sub-pixel groups of three different colors, the sub-pixel groups in each of the repeating units are arranged in one row, and two sub-pixel groups between which two sub-pixel groups are arranged, have the same color. Exemplarily, as illustrated in FIG. 1 and FIG. 2, in the repeating unit 1000, six sub-pixel groups are arranged in one row, the second sub-pixel group 120 and the third sub-pixel group 130 are arranged between two first sub-pixel groups 110, the first sub-pixel group 110 and the third sub-pixel group 130 are arranged between two second sub-pixel groups 120, and the first sub-pixel group 110 and the second sub-pixel groups 120 are arranged between two third sub-pixel groups 130.

For example, in the pixel arrangement structure according to at least one embodiment of the present disclosure, because the centroids of the three sub-pixels 101 in the same sub-pixel group 10 are configured to be linked to constitute the first virtual triangle 20, in a case where the three sub-pixels 101, which belong to different sub-pixel groups 10 and are adjacent to each other, constitute one pixel 01, the three sub-pixels 101, in the pixel 01, of three different colors, such as a red (R) sub-pixel 101, a green (G) sub-pixel 101, and a blue (B) sub-pixel 101, are not located in the same row. Therefore, the pixel arrangement structure provided by the embodiments of the present disclosure described above is different from a pixel structure which adopts pixels arranged in a matrix and where at least three sub-pixels in each pixel are located in the same row. The pixel arrangement structure in the embodiments of the present disclosure described above allows to reduce the requirement for the size of the opening of the mask, or to improve the resolution by manufacturing more sub-pixels in a case where the size of the opening of the mask is fixed.

In a case where the pixel arrangement structure described above according to at least one embodiment of the present disclosure is adopted, because each of the sub-pixel groups 10 in the pixel arrangement structure includes three sub-pixels 101 of the same color, in a case where the pixel arrangement structure described above is applied to an OLED display panel, when a light emitting layer in the sub-pixel 101 is evaporated by an evaporation process, each of openings on the mask adopted in the evaporation process may correspond to a position of one of the sub-pixel groups 10 described above. Furthermore, a region where the opening is located needs to cover at least a region where the sub-pixel group 10 corresponding to the opening is located. In this manner, three sub-pixels 101 of the same color in the sub-pixel group 10 corresponding to the position of the opening may be evaporated simultaneously through one opening on the mask. In this case, although the size of the opening on the mask may not be further reduced due to an influence of the manufacturing process, compared with the current evaporation process, the three sub-pixels 101 located in the same sub-pixel group 10 in the pixel arrangement structure may be evaporated and formed through one opening. That is, under the same limitation of the size of the opening, more sub-pixels may be formed, thereby improving the resolution of the OLED display device.

In at least one embodiment of the present disclosure, a film layer to be evaporated (for example, the light emitting layer) in the three sub-pixels 101 in the same sub-pixel group 10 may be evaporated and formed through the same one opening on the mask, so that the light emitting layers in the three sub-pixels 101 in each of the sub-pixel groups 10 are actually connected to each other. However, during display, the light emitting layer between the three sub-pixels 101 covers on a pixel define layer (PDL). Therefore, the light emitting layer overlapping with the pixel define layer does not emit light because there is no anode to drive thereto, and this part of light emitting layer does not affect the display of the three sub-pixels 101 described above.

For example, a plurality of holes are provided in the pixel define layer. The hole exposes the anode and forms a recess with the anode, and at least a part of the light emitting functional layer (e.g., an organic light emitting layer) of the light emitting device is formed in the recess. For example, a planar shape of the sub-pixel may be the same as a planar shape of the recess. For example, in a case where the planar shape of the recess is a regular hexagon, the planar shape of the sub-pixel is a regular hexagon as illustrated in FIG. 2.

Hereinafter, a specific arrangement of the pixel arrangement structure described above are further described.

For example, in the pixel arrangement structure according to at least one embodiment of the present disclosure, the sub-pixel groups may include a first sub-pixel group, a second sub-pixel group, and a third sub-pixel group, which are of different colors. As illustrated in FIG. 2, the first sub-pixel group 110 includes three red (R) sub-pixels 101; the second sub-pixel group 120 includes three green (G) sub-pixels 101; and the third sub-pixel group 130 includes three blue (B) sub-pixels 101.

For example, the first sub-pixel group, the second sub-pixel group, and the third sub-pixel group are arranged in a plurality of rows and a plurality of columns and are alternately arranged in sequence in each of rows. As illustrated in FIG. 2, in the sub-pixel groups 10 in the same row, the second pixel group 120 and the third sub-pixel group 130 are arranged between two adjacent first sub-pixel groups 110, and in the same row, the first sub-pixel group 110, the second sub-pixel group 120, and the third sub-pixel group 130 are arranged in sequence and are adjacent to each other.

For example, in the pixel arrangement structure according to at least one embodiment of the present disclosure, the sub-pixel groups 10 in the same row refer to that, in the pixel arrangement structure, the first virtual triangles 20, constituted by connecting the centroids of three sub-pixels 101 in the sub-pixel group 10, are arranged in one row in the horizontal direction (X direction).

For example, in the pixel arrangement structure according to at least one embodiment of the present disclosure, the sub-pixel groups 10 in the same column refer to that, in the pixel arrangement structure, the first virtual triangles 20, constituted by connecting the centroids of three sub-pixels 101 in the sub-pixel group 10, are arranged in one column in the vertical direction (Y direction).

It should be noted that, in the embodiments of the present disclosure, the orientation terms such as "horizontal", "vertical", "upper", "lower", etc., are defined relative to an orientation where the pixel arrangement structure is schematically arranged in the accompanying drawings. It should be understood that these orientation terms are relative concepts for relative description and clarification, which may vary accordingly depending on a change in the orientation where the pixel arrangement structure is arranged.

For example, in the pixel arrangement structure according to at least one embodiment of the present disclosure, in the case where each repeating unit includes sub-pixel groups of three different colors, in the sub-pixel groups in the same row, arrangements of the sub-pixels in adjacent sub-pixel groups are different.

For example, in the pixel arrangement structure according to at least one embodiment of the present disclosure, as illustrated in FIG. 2, in the sub-pixel groups 10 in the same row, vertex angles of first virtual triangles 20 in two adjacent sub-pixel groups of the same color have opposite directions.

For example, in the sub-pixel groups 10 in the (i)th row, among the two adjacent first sub-pixel groups 110, the vertex angle of the first virtual triangle 20 in the first sub-pixel group 110 in the (j)th column is upward (for example, the first virtual triangle 20 is a regular triangle), while the vertex angle of the first virtual triangle 20 in the first sub-pixel group 110 in the (j+6)th column is downward (for example, the first virtual triangle 20 is an inverted triangle), where i≥1, j≥1, and i and j are positive integers.

For example, in the pixel arrangement structure according to at least one embodiment of the present disclosure, as illustrated in FIG. 2, in the sub-pixel groups 10 in the same row, the vertex angles of the first virtual triangles 20 in two adjacent sub-pixel groups 10 of different colors have opposite directions.

For example, as illustrated in FIG. 2, in the sub-pixel groups 10 in the (i)th row, in the two sub-pixel groups 10 of different colors, the vertex angle of the first virtual triangle 20 in the first sub-pixel group 110 in the (j)th column is upward (for example, the first virtual triangle 20 is a regular triangle), while the vertex angle of the first virtual triangle 20 in the second sub-pixel group 120 in the (j+2)th column is downward (for example, the first virtual triangle 20 is an inverted triangle).

For example, in the pixel arrangement structure according to at least one embodiment of the present disclosure, as illustrated in FIG. 2, in the sub-pixel groups 10, of the same color, in the same column, the vertex angles of the first virtual triangles 20 in two adjacent sub-pixel groups 10 have the same direction.

For example, as illustrated in FIG. 2, the vertex angles of the first virtual triangles 20 in the first sub-pixel groups 110 in the (j)th column are all upward (for example, the first virtual triangles 20 are regular triangles).

For example, in the pixel arrangement structure according to at least one embodiment of the present disclosure, as illustrated in FIG. 2, an arrangement order of the first sub-pixel 110, the second sub-pixel 120 and the third sub-pixel group 130 in the sub-pixel groups 10 in the (i)th row is the same as an arrangement order of the first sub-pixel 110, the second sub-pixel 120 and the third sub-pixel group 130 in the sub-pixel groups 10 in the (i+2)th row.

For example, in a case where, in the sub-pixel groups 10 in the (i)th row, sub-pixel groups are sequentially arranged in sequence in an order of the first sub-pixel group 110, the second sub-pixel group 120 and the third sub-pixel group 130, in the sub-pixel groups 10 in the (i+2)th row, sub-pixel groups are sequentially arranged in the order of the first sub-pixel group 110, the second sub-pixel group 120 and the third sub-pixel group 130 as well.

For example, in the pixel arrangement structure according to at least one embodiment of the present disclosure, as illustrated in FIG. 2, an arrangement position of the first sub-pixel group 110 in the (i)th row and an arrangement position of the first sub-pixel group 110 in the (i+1)th row are staggered. For example, a position of the first sub-pixel group 110 located in the (i)th row and the (j)th column and a position of the first sub-pixel group 110 located in the (i+1)th row and the (j+3)th column are staggered.

For example, in the pixel arrangement structure according to at least one embodiment of the present disclosure, one column of second sub-pixel groups 120 and one column of third sub-pixel groups 130 are arranged between two adjacent columns of first sub-pixel groups 110.

For example, as illustrated in FIG. 2, the first sub-pixel group 110 in the (j)th column and the first sub-pixel group 110 in the (j+3)th column are the two adjacent columns of first sub-pixel groups 110. The third sub-pixel group 130 in the (j+1)th column and the second sub-pixel group 120 in the (j+2)th column are located between the first sub-pixel group 110 in the (j)th column and the first sub-pixel group 110 in the (j+3)th column.

In a case where the arrangement position of the first sub-pixel group 110 in the (i)th row and the arrangement position of the first sub-pixel group 110 in the (i+1)th row are staggered, in third sub-pixel groups 130 in the (j+1)th column, a first one of the third sub-pixel groups 130 is located in the (i+1)th row, and in second sub-pixel groups 120 in the (j+2)th column, a first one of the second sub-pixel groups 120 is located in the (i)th row. In this way, the sub-pixel groups 10 adjacent to the first sub-pixel group 110 may be the second sub-pixel group 120 and the third sub-pixel group 130, so that three sub-pixels 101, which belong to different sub-pixel groups 10 and are adjacent to each other, constitute one pixel 01.

It should be noted that, in the pixel arrangement structure according to the embodiments of the present disclosure described above, the arrangement of pixels is described based on the first sub-pixel group 110, and the arrangement of the second group 120 and the arrangement of the third sub-pixel group 130 may be referred to the description about the arrangement of the first sub-pixel group 110, the second sub-pixel group 120 and the third sub-pixel group 130 in the embodiments described above, which are not repeated herein.

Figure 3:
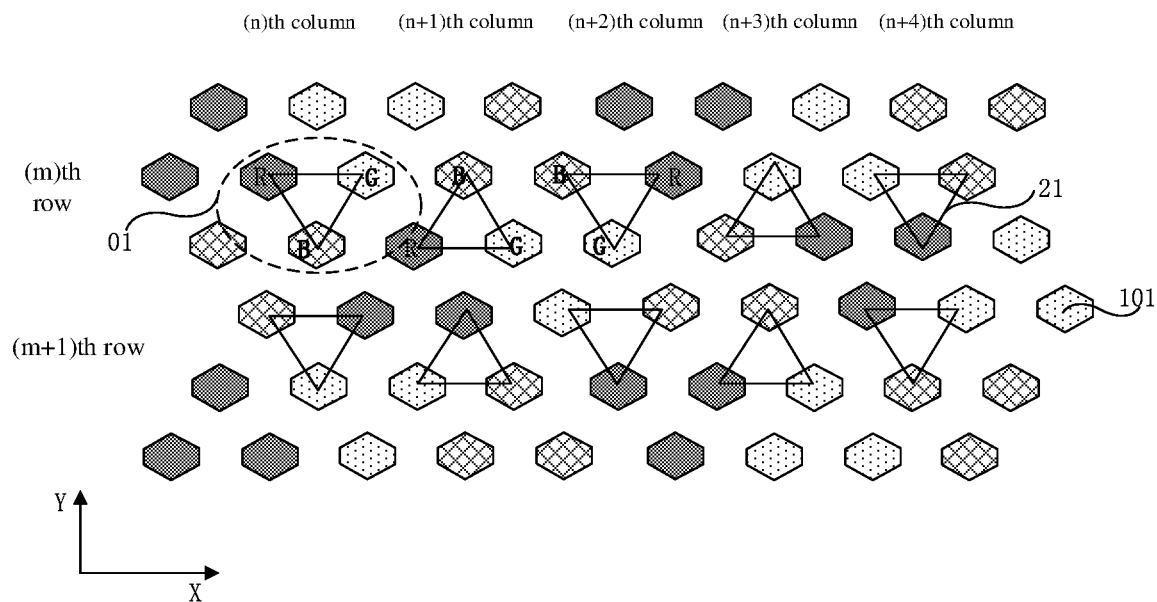
FIG. 3 is a schematic diagram of a pixel consisting of a plurality of sub-pixels in the pixel arrangement structure illustrated in FIG. 2.

For example, in the pixel arrangement structure according to the above-mentioned embodiments of the present disclosure, as illustrated in FIG. 3, in the same pixel 01, the centroids (for example, the centers) of the sub-pixels 101 of three different colors are configured to be linked to constitute a second virtual triangle 21.

For example, in the pixel arrangement structure according to the above-mentioned embodiments of the present disclosure, as illustrated in FIG. 3, in the pixels 10 in the same row, the vertex angles of the second virtual triangles 21 in two adjacent pixels 01 have opposite directions.

For example, as illustrated in FIG. 3, in pixels 01 in the (m)th row, the pixel 01 located in the nth column is adjacent to the pixel 01 located in the (n+1)th column, and the vertex angle of the second virtual triangle 21 in the pixel 01 in the nth column is downward (for example, the second virtual triangle 21 is an inverted triangle), while the vertex angle of the second virtual triangle 21 in the pixel 01 in the (n+1)th column is upward (for example, the second virtual triangle 21 is a regular triangle), where n≥1, m≥1, and n and m are positive integers.

For example, in at least one embodiment of the present disclosure, the pixels 01 in the same row refers to that, in the pixel arrangement structure, the second virtual triangles 21, constituted by connecting the centroids of three sub-pixels 101 in the pixels 01, are arranged in one row in the horizontal direction (for example, X direction).

For example, in at least one embodiment of the present disclosure, the pixels 01 in the same column refers to that, in the pixel arrangement structure, the second virtual triangles 21, constituted by connecting the centroids of three sub-pixels 101 in the pixels 01, are arranged in one column in the vertical direction (for example, Y direction).

For example, in at least one embodiment of the present disclosure, as illustrated in FIG. 2 and FIG. 3, the position of the sub-pixel groups 10 in one row is different from that of pixels 01 in one row. Based on this, in the pixels 10 in the same column, the vertex angles of the second virtual triangles 21 in any two of the pixels 01 may have the same direction. For example, as illustrated in FIG. 3, in the pixels 10 in the nth column, the vertex angles of the second virtual triangles 21 of any two of the pixels 01 are downward (for example, the second virtual triangles 21 are inverted triangles), while in the pixels in the (n+1)th column, the vertex angles of the second virtual triangles 21 of any two of the pixels 01 are upward (for example, the second virtual triangles 21 are regular triangles).

For example, in some other embodiments of the present disclosure, as illustrated in FIG. 12, each of the repeating units 1000 includes four sub-pixel groups of different colors, and a same sub-pixel group includes four sub-pixels (for example, 110a, 120a, 130a, 140a in FIG. 12). The centroids of the sub-pixels in each of the sub-pixel groups are configured to be linked to constitute a first virtual quadrilateral 20a, and four adjacent sub-pixels, which are of different colors and belong to different sub-pixel groups, constitute one pixel 01a, that is, the pixel 01a includes four sub-pixels of different colors, which respectively belong to four sub-pixel groups of different colors. For example, the first virtual quadrilateral 20a may be a rectangle, such as a square.

For example, in some other embodiments of the present disclosure, as illustrated in FIG. 12, the four sub-pixel groups of different colors include a first sub-pixel group 110a, a second sub-pixel group 120a, a third sub-pixel group 130a, and a fourth sub-pixel group 140a. The first sub-pixel group 110a, the second sub-pixel group 120a, the third sub-pixel group 130a and the fourth sub-pixel group 140a are arranged in a plurality of rows and a plurality of columns (for example, the (i)th row~the (i+1)th row, the (j)th column~the (j+1)th column), and adjacent sub-pixel groups are located in the same row or in the same column. Exemplarily, as illustrated in FIG. 12, the first sub-pixel group 110a and a part of the third sub-pixel group 130a are located in the same row, the first sub-pixel group 110a and another part of the third sub-pixel group 130a are located in the same column, and the first sub-pixel group 110a, the second sub-pixel group 120a and the fourth sub-pixel group 140a are located in the same row.

For example, in some other embodiments of the present disclosure, as illustrated in FIG. 12, the sub-pixel group in the (i)th row and the (j)th column has the same color as the sub-pixel group in the (i+1)th row and the (j+2)th column, the sub-pixel group in the (i)th row and the (j)th column has the same color as the sub-pixel group in the (i+2)th row and the (j)th column, and i and j are positive integers. Exemplarily, as illustrated in FIG. 12, a region corresponding to the (i)th row and the (j)th column is provided with the first sub-pixel group 110a, and a region corresponding to the (i+1)th row and the (j+2)th column and a region corresponding to the (i+2)th row and the (j)th column are both provided with the first sub-pixel group 110a. For example, a region corresponding to the (i)th row and the (j+1)th column is provided with the second sub-pixel group 120a, and a region corresponding to the (i+1)th row and the (j+3)th column and a region corresponding to the (i+2)th row and the (j+1)th column are both provided with the second sub-pixel group 120a. The arrangement of the third sub-pixel group 130a and the arrangement of the fourth sub-pixel group 140a can be referred to the description of the arrangement of the first sub-pixel group 110a and the second sub-pixel group 120a described above, and details are not described herein.

For example, in some other embodiments of the present disclosure, as illustrated in FIG. 12, in the same pixel, the centroids (e.g., centers) of four different sub-pixels are configured to be linked to constitute a second virtual quadrilateral 21a. For example, the second virtual quadrilateral 21a may be a rectangle, such as a square.

In at least one embodiment of the present disclosure, the planar shape of the sub-pixel 101 is not limited, which may be designed based on actual needs. For example, in at least one embodiment of the present disclosure, the planar shape of the sub-pixel may be one or a combination of a circle, a triangle, a rectangle, and a polygon.

Figure 4:
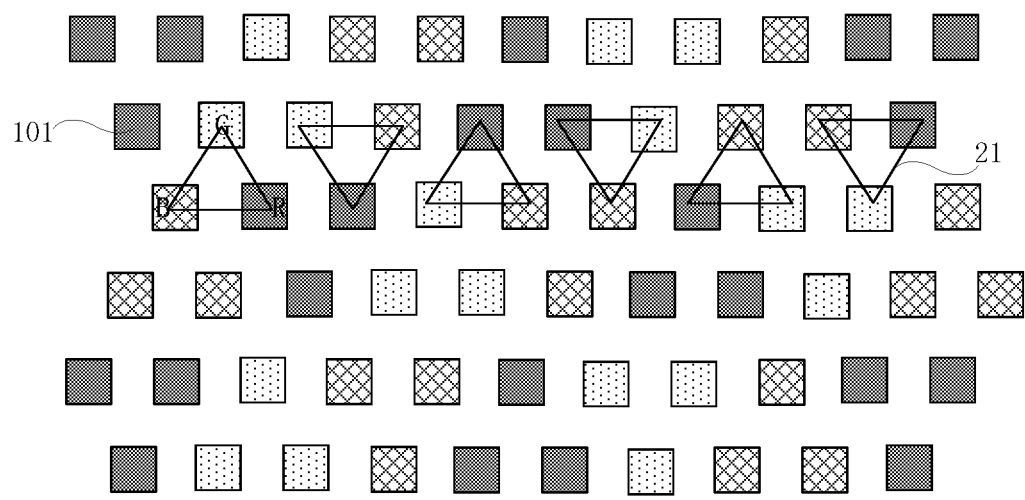
FIG. 4 is a schematic diagram of yet another pixel arrangement structure provided by some embodiments of the present disclosure.

For example, the planar shape of the sub-pixel 101 may be a regular hexagon as illustrated in FIG. 1, FIG. 2 or FIG. 3, or the planar shape of the sub-pixel 101 may further be a square as illustrated in FIG. 4, or the planar shape of the sub-pixel 101 may further be a circle. For example, when the sub-pixel 101 is the regular hexagon, in a case where an area of the sub-pixel 101 is constant, a higher aperture ratio and a higher light transmittance can be obtained, and the brightness of the displayed image may be improved.

For example, in at least one embodiment of the present disclosure, in each of the sub-pixel groups, a pattern formed by the centroids of the sub-pixels is a regular pattern, and thus, the sub-pixels 101 in the pixel arrangement structure may be uniformly distributed. For example, in at least one embodiment of the present disclosure, the first virtual triangle 20 as illustrated in FIG. 2 and the second virtual triangle 21 as illustrated in FIG. 3 may be equilateral triangles.

For example, in the pixel arrangement structure according to some embodiments of the present disclosure, the first sub-pixel group 110 includes three red (R) sub-pixels 101, the second sub-pixel group 120 includes three green (G) sub-pixels 101, and the third sub-pixel group 130 includes three blue (B) sub-pixels 101. For example, in the pixel arrangement structure according to some other embodiments of the present disclosure, the arrangement of the sub-pixel groups may further be that the first sub-pixel group 110 includes three cyan (C) sub-pixels 101, the second sub-pixel group 120 includes three magenta (M) sub-pixels 101, and the third sub-pixel group 130 includes three yellow (Y) sub-pixels 101. In the embodiments of the present disclosure, the specific color of the sub-pixel group is not limited, and the specific color of the sub-pixel group may be designed as needed.

At least one embodiment of the present disclosure provides a display panel, which may include the pixel arrangement structure according to any one of the embodiments described above. The display panel has the same technical effects as the pixel arrangement structure according to the foregoing embodiments, and details are not described herein again.

For example, in at least one embodiment of the present disclosure, the display panel may be a LED display panel, or an OLED display panel in which a light emitting layer in a light emitting device is formed by an organic light emitting layer. The display panel described above may be any product or any component that has a display function, such as a television, a digital camera, a mobile phone, a watch, a tablet PC, a notebook computer, a navigator, etc.

It should be noted that, for clarity, an entire structure of the display substrate and the display panel in at least one embodiment are not illustrated in the present disclosure. In order to realize the necessary functions of the display substrate and the display panel, those skilled in the art may provide other structures (for example, a touch structure, a light splitting device to realize a naked-eye 3D display, etc.) according to specific application scenarios, and the embodiments of the present disclosure are not limited thereto.

At least one embodiment of the present disclosure provides a mask component for manufacturing the pixel arrangement structure according to any one of the embodiments described above. The mask component includes at least one mask. The mask is provided with a plurality of openings. During evaporation, each of the openings corresponds to one sub-pixel group, and the region where the opening is located covers the region where the sub-pixel group corresponding to the opening is located. Exemplarily, the mask component may include at least one mask 02 as illustrated in FIG. 5 (FIG. 5 illustrates a part of the mask 02).

For example, in the mask component according to at least one embodiment of the present disclosure, the mask 02 is provided with a plurality of openings 30. During evaporation, each of the openings 30 corresponds to one sub-pixel group, and the region where the opening 30 is located covers the region where the sub-pixel group corresponding to the opening 30 is located.

For example, in the mask component according to at least one embodiment of the present disclosure, all of the openings 30 on the mask 02 correspond to the sub-pixel groups of the same color. For example, all of the openings 30 on the mask 02 illustrated in FIG. 5 are in one-to-one correspondence with all of the sub-pixel groups 10 in the pixel arrangement structure illustrated in FIG. 6. In this way, one of the openings 30 in the mask 02 may be used in the evaporation process to simultaneously form film layers (for example, the light emitting layers) to be evaporated in three sub-pixels 101 in the sub-pixel group 10 corresponding to the one of the openings 30. While the requirement for the size of the opening of the mask is reduced, the plurality of sub-pixels may further be manufactured through one of the openings of the mask, thereby increasing the count of the sub-pixels, and improving the resolution of the display panel.

Figure 5:
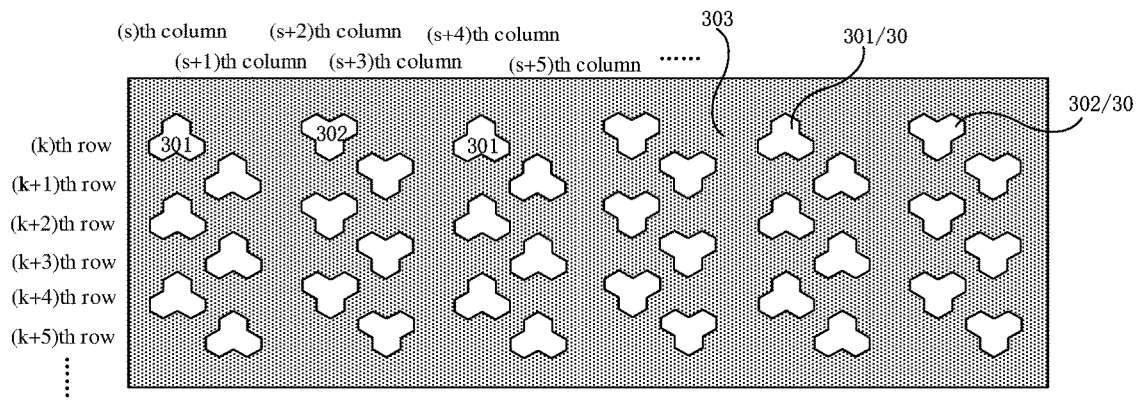
FIG. 5 is a schematic structural diagram of a mask in a first mask component provided by some embodiments of the present disclosure.

For example, in the mask component according to at least one embodiment of the present disclosure, in the case where the at least three sub-pixel groups 10 of different colors include the first sub-pixel group 110, the second sub-pixel group 120, and the third sub-pixel group 130, as illustrated in FIG. 5, the plurality of openings 30 on the mask 02 include a plurality of first openings 301 and a plurality of second openings 302. For example, the first openings and the second openings correspond to the sub-pixel groups having one kind of colors and having the first virtual triangles with different vertex angle directions, respectively. For example, the first opening 301 in FIG. 5 corresponds to the first sub-pixel group 110 of the first virtual triangle 20 (e.g., a regular triangle) with an upward vertex angle in FIG. 6, and the second opening 302 corresponds to the first sub-pixel group 110 of the first virtual triangle 20 (e.g., a regular triangle) with a downward vertex angle. For example, in at least one embodiment of the present disclosure, "correspond(s)" refers to shape matching. For example, in the evaporation process, the first opening 301 has a same shape or a similar shape as the first virtual triangle 20 with the upward vertex angle, and the orthogonal projection of the first virtual triangle 20 with the upward vertex angle on the mask is superimposed with the orthogonal projection of the first opening 301 on the mask, or is located within the orthogonal projection of the first opening 301 on the mask. The second opening 302 has a same shape or a similar shape as the first virtual triangle 20 with the downward vertex angle. The orthogonal projection of the first virtual triangle 20 with the downward vertex angle on the mask is superimposed with the orthogonal projection of the second opening 302 on the mask, or is located within the orthogonal projection of the second opening 302 on the mask.

Figure 6:
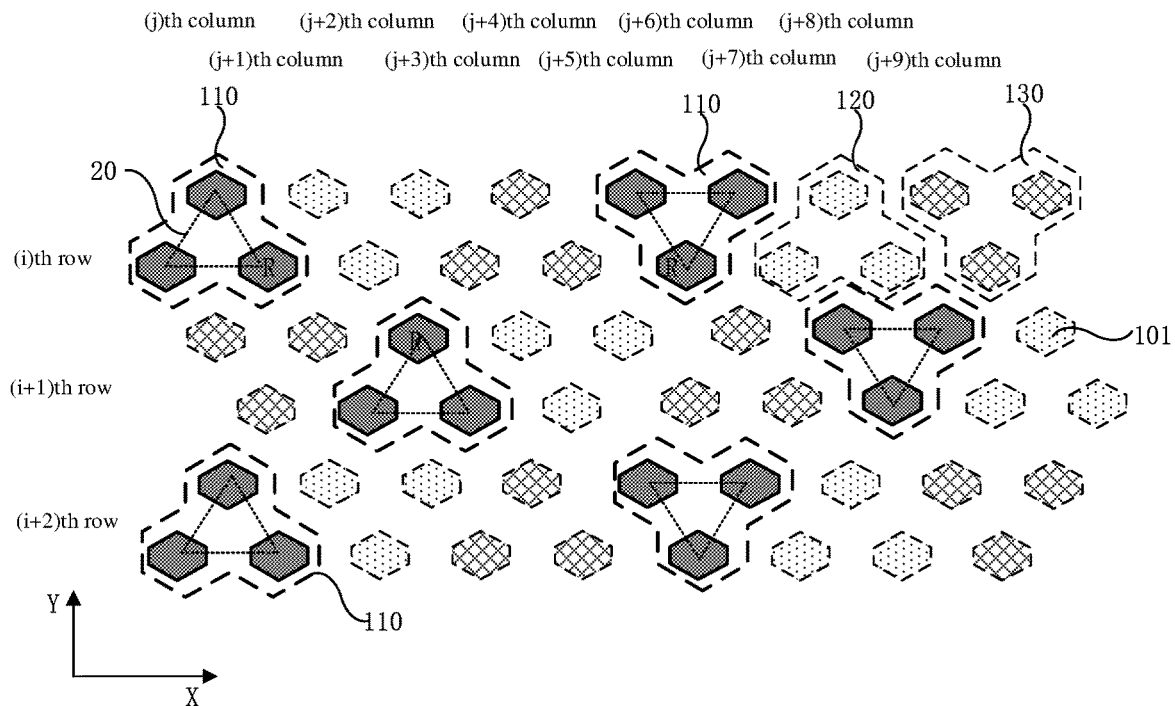
FIG. 6 is a schematic diagram of evaporation performed to form the first sub-pixel group in FIG. 2 by using the mask illustrated in FIG. 5.

For example, in the mask component according to at least one embodiment of the present disclosure, as illustrated in FIG. 5, first openings 301 in the (s)th column are in one-to-one correspondence with the first sub-pixel groups 110 in the (j)th column in FIG. 6, thereby evaporating the film layers to be evaporated (for example, the light emitting layers) of each of the sub-pixels 101 in the first sub-pixel groups 110 in the (j)th column through the first openings 301 in the (s)th column.

For example, in the mask component according to at least one embodiment of the present disclosure, as illustrated in FIG. 5, the first openings 301 in the (s+1)th column are in one-to-one correspondence with the first sub-pixel groups 110 in the (j+3)th column in FIG. 6. The second openings 302 in the (s+2)th column in FIG. 5 are in one-to-one correspondence with the first sub-pixel groups 110 in the (j+6)th column in FIG. 6. The second openings 302 in the (s+3)th column in FIG. 5 are in one-to-one correspondence with the first sub-pixel groups 110 in the (j+9)th column in FIG. 6. Remaining openings of the mask component correspond to the sub-pixel groups in the same manner as described above, which are not repeated herein, where s≥1, k≥1, and s and k are positive integers.

For example, in the mask component according to at least one embodiment of the present disclosure, in the case where the first openings and second openings correspond to the sub-pixel groups of a same color, a light shielding region between adjacent first opening and second opening located in the same row corresponds to the sub-pixel groups of other colors. As illustrated in FIG. 5, a light shielding region 303 between a first opening 301 and a second opening 302 that are adjacent and located in the same row corresponds to the second group 120 and the third sub-pixel group 130 in FIG. 6.

In some embodiments of the present disclosure, evaporation is performed on the light emitting layer of the first sub-pixel group 110 in the pixel arrangement structure by the mask 02, which may be referred to the related description in the embodiment illustrated in FIG. 5. In some other embodiments of the present disclosure, in a case where the size of the mask 02 is sufficiently large, after the evaporation of the light emitting layer of the first sub-pixel groups 110 described above is completed, the light emitting layer of the second sub-pixel groups 120 in the pixel arrangement structure may be evaporated by changing an alignment position between the mask 02 and the pixel arrangement structure to be evaporated.

Figure 7:
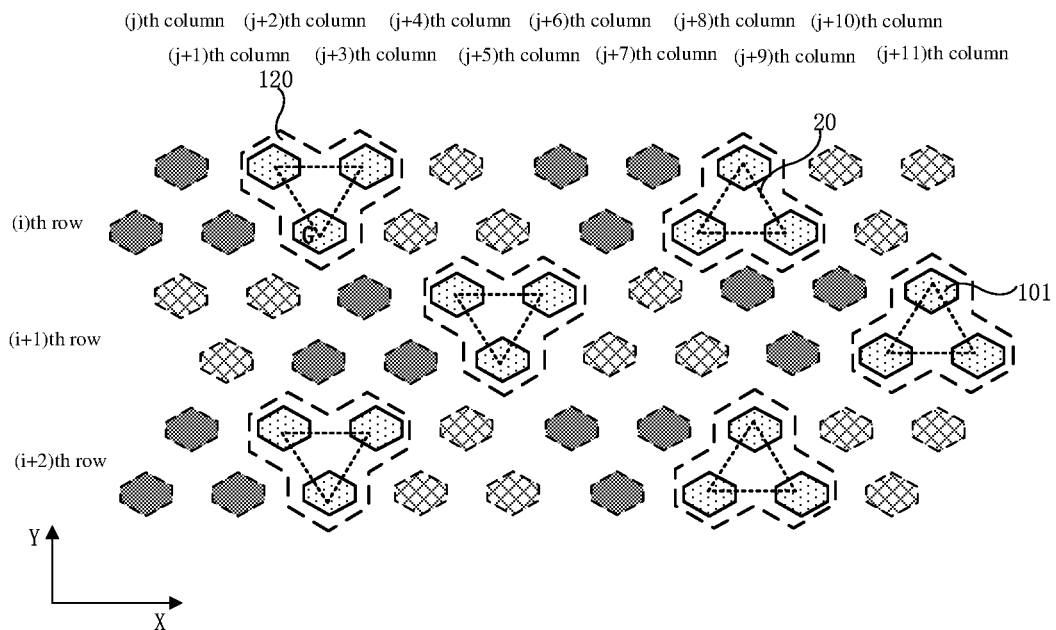
FIG. 7 is a schematic diagram of evaporation performed to form the second sub-pixel group in FIG. 2 by using the mask illustrated in FIG. 5.

For example, in at least one embodiment of the present disclosure, in a case where the light emitting layer of the second sub-pixel groups 120 in the pixel arrangement structure is evaporated by the mask 02 illustrated in FIG. 5, for example, in FIG. 5, the second openings 302 in the (s+2)th column are in one-to-one correspondence with the second sub-pixel groups 120 in the (j+2)th column in FIG. 7, thereby evaporating the light emitting layer of each of the sub-pixels 101 in the second sub-pixel groups 120 in the (j+2)th column through the second openings 302 in the (s+2)th column.

For example, in at least one embodiment of the present disclosure, as illustrated in FIG. 5, the second openings 302 in the (s+3)th column of the mask are in one-to-one correspondence with the second sub-pixel groups 120 in the (j+5)th column in FIG. 7; the first openings 301 in the (s+4)th column in FIG. 5 are in one-to-one correspondence with the second sub-pixel groups 120 in the (j+8)th column in FIG. 7; and the first openings 301 in the (s+5)th column in FIG. 5 are in one-to-one correspondence with the second sub-pixel groups 120 in the (j+11)th column in FIG. 7. The remaining openings of the mask correspond to the sub-pixel groups in the same manner as describe above, which are not repeated herein.

For example, in at least one embodiment of the present disclosure, after the light emitting layer of the second sub-pixel groups 120 described above is evaporated, the light emitting layer of the third sub-pixel groups 130 in the pixel arrangement structure may be evaporated by changing the alignment position between the mask 02 and the pixel arrangement structure to be evaporated.

Figure 8:
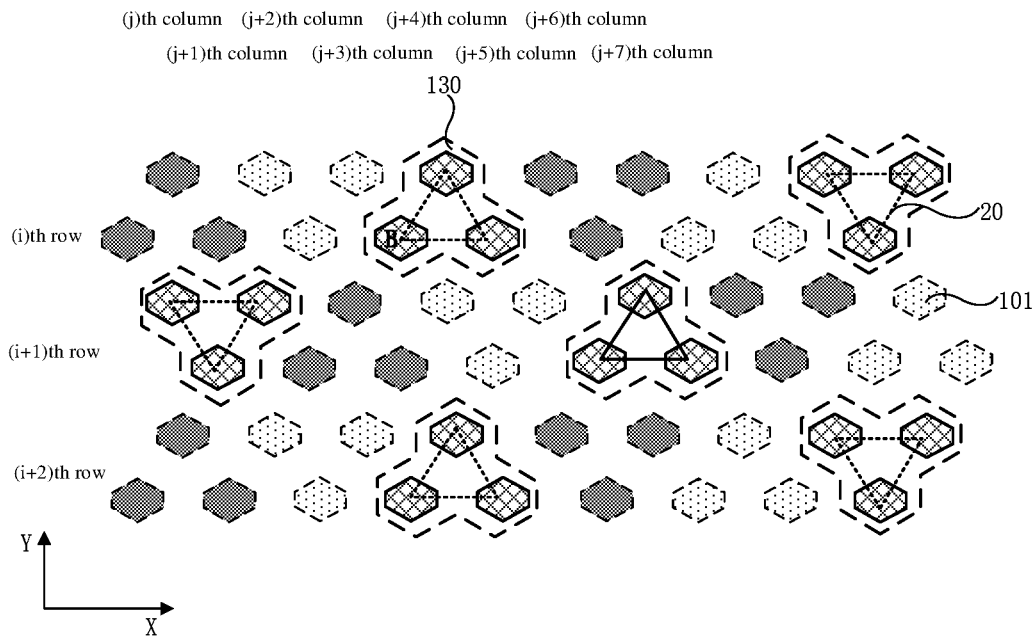
FIG. 8 is a schematic diagram of evaporation performed to form the third sub-pixel group in FIG. 2 by using the mask illustrated in FIG. 5.

For example, in at least one embodiment of the present disclosure, in a case where the light emitting layer of the third sub-pixel groups 130 in the pixel arrangement structure is evaporated by the mask 02 illustrated in FIG. 5, for example, the second openings 302 in the (s+3)th column in FIG. 5 are in one-to-one correspondence with the third sub-pixel groups 130 in the (j+1)th column in FIG. 8, thereby evaporating the light emitting layer of each of the sub-pixels 101 in the third sub-pixel groups 130 in the (j+1)th column through the second openings 302 in the (s+3)th column.

For example, in at least one embodiment of the present disclosure, as illustrated in FIG. 5, the first openings 301 in the (s+4)th column are in one-to-one correspondence with the third sub-pixel groups 130 in the (j+4)th column in FIG. 8. The first openings 301 in the (s+5)th column in FIG. 5 are in one-to-one correspondence with the third sub-pixel groups 130 in the (j+7)th column in FIG. 8. The remaining openings of the mask component correspond to the sub-pixel groups in the same manner as described above, which are not repeated herein.

For example, in at least one embodiment of the present disclosure, in a case where sub-pixel groups 10 of three different colors are separately evaporated by one mask 02, the size of the mask 02 is required to be sufficiently large, so that each time the position of the mask 02 is moved during evaporation, it can be ensured that the positions to be evaporated on the display panel correspond to the openings 30 of the mask 02. For example, during the evaporation process, the mask may be soldered to a mask frame, and the mask frame is utilized to support the mask to ensure the evaporation yield.

Figure 9:
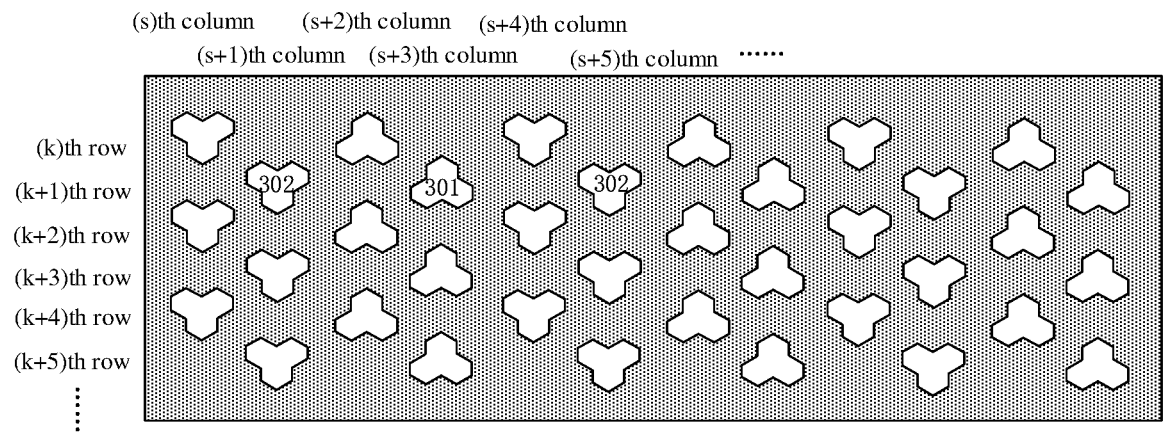
FIG. 9 is a schematic structural diagram of another mask in a first mask component provided by some embodiments of the present disclosure.

For example, in the mask component according to at least one embodiment of the present disclosure, the mask 01 may include a first mask 310 illustrated in FIG. 5, a second mask 320 illustrated in FIG. 9, and a third mask 330 illustrated in FIG. 5. For example, each of the openings 30 on the first mask 310 corresponds to one of the first sub-pixel groups 110. The case where each of the openings 30 on the first mask 310 corresponds to one of the first sub-pixel groups 110 is the same as that described above, and details are not described herein again.

For example, in at least one embodiment of the present disclosure, each of the openings on the second mask 320 as illustrated in FIG. 9 corresponds to the region where one of the second sub-pixel groups 120 is located. For example, the second openings 301 in the (s)th column in FIG. 9 are in one-to-one correspondence with the second sub-pixel groups 120 in the (j+2)th column in FIG. 7; in addition, the second openings 302 in the (s+1)th column in FIG. 9 are in one-to-one correspondence with the second sub-pixel groups 120 in the (j+5)th column in FIG. 7; the first openings 301 in the (s+2)th column in FIG. 9 are in one-to-one correspondence with the second sub-pixel groups 120 in the (j+8)th column in FIG. 7; and the first openings 301 in the (s+3)th column in FIG. 9 are in one-to-one correspondence with the second sub-pixel groups 120 in the (j+11)th column in FIG. 7. The remaining openings correspond to the sub-pixel groups in the same manner as described above, which are not repeated herein.

For example, in at least one embodiment of the present disclosure, as illustrated in FIG. 5, each of the openings 30 on the third mask 330 corresponds to the region where one of the third sub-pixel groups 130 is located. The case where each of the openings 30 on the third mask 330 corresponds to one of the third sub-pixel groups 130 is the same as that described above, and details are not described herein again.

Figure 10:
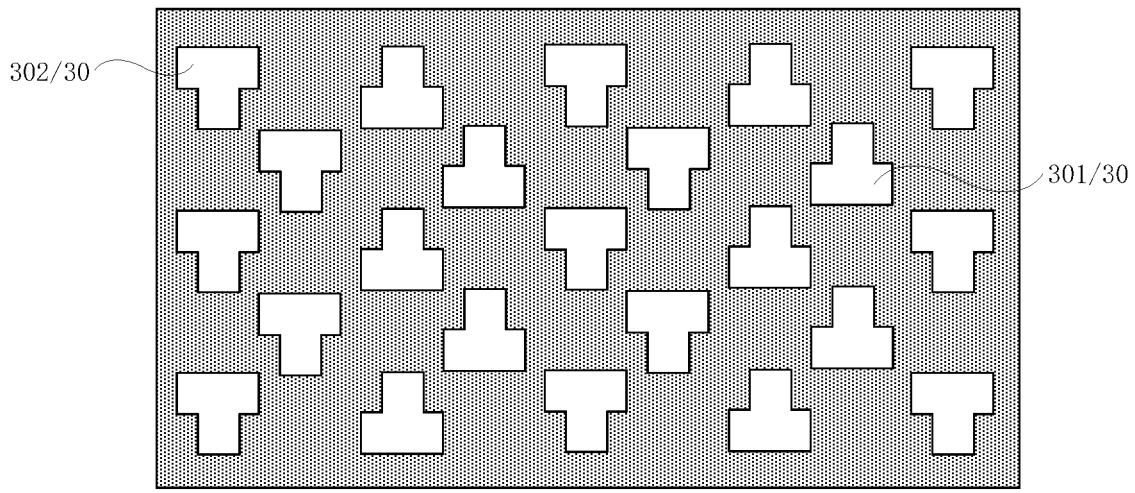
FIG. 10 is a schematic structural diagram of a mask in a second mask component provided by some embodiments of the present disclosure.
Figure 11:
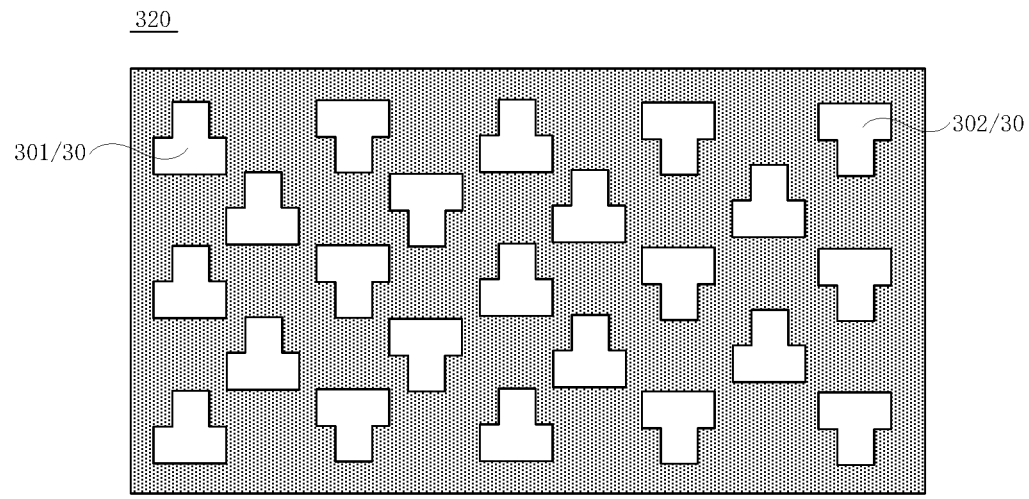
FIG. 11 is a schematic structural diagram of another mask in a second mask component provided by some embodiments of the present disclosure.

For example, in the embodiments of the present disclosure described above, the description is provided by taking that the planar shape of the sub-pixel 101 is a regular hexagon as an example. For example, in some other embodiments of the present disclosure, the shape of the sub-pixel 101 may be a square as illustrated in FIG. 4. The mask component may include a first mask 310 as illustrated in FIG. 10, a second mask 320 as illustrated in FIG. 11, and a third mask 330 as illustrated in FIG. 10. A manner in which the mask 02 described above corresponds to the sub-pixel groups 10 of different colors is the same as described above, which are not repeated herein.

For example, in the embodiments of the present disclosure described above, the light emitting layers of the first sub-pixel groups 110, the second sub-pixel groups 120 and the third sub-pixel groups 130 are evaporated by the first mask 310, the second mask 320, and the third mask 330, respectively, without disassembling the mask soldered on the mask frame, and thereby simplifying the manufacturing process of the evaporation process.

For example, in at least one embodiment of the present disclosure, in a case where the evaporation is performed by using the mask component described above, the order of usage of the first mask 310, the second mask 320 and the third mask 330 is not limited. For example, the film layers (for example, the light emitting layers) in the first sub-pixel groups 110, the second sub-pixel groups 120 and the third sub-pixel groups 130 may be evaporated in sequence by using the first mask 310, the second mask 320 and the third mask 330.

For example, in at least one embodiment of the present disclosure, the shape of the opening 30 in the mask 01 may be designed based on the requirements of the actual process, as long as the region where the opening 30 is located covers the region where the sub-pixel group 10 corresponding to the opening 30 is located. For example, a part of the shape of an edge of the opening 30 may be the same as a part of the shape of an edge of each of the sub-pixels 101 in the sub-pixel group 10 corresponding to the opening 30. For example, in a case where the sub-pixel 101 is a hexagon, as illustrated in FIG. 5 or FIG. 9, a part of the edge of the opening 30 is the same as a part of the edge of the hexagon. Alternatively, in a case where the sub-pixel 101 is a square, as illustrated in FIG. 10 or FIG. 11, a part of the edge of the opening 30 is the same as a part of the edge of the square.

For example, in at least one embodiment of the present disclosure, the pixel arrangement structure to be formed is illustrated in FIG. 12, and at least one mask includes a first mask, a second mask, a third mask, and a fourth mask. Each of the openings on the first mask corresponds to one of the first sub-pixel groups. Each of the openings on the second mask corresponds to one of the second sub-pixel groups. Each of the openings on the third mask corresponds to one of the third sub-pixel groups, and each of the openings on the fourth mask corresponds to one of the fourth sub-pixel groups. In this way, the sub-pixel groups of different colors (for example, the light emitting layers therein) are evaporated by using different masks, without disassembling the mask soldered on the mask frame, and thereby simplifying the manufacturing process of the evaporation process.

Figure 13A:
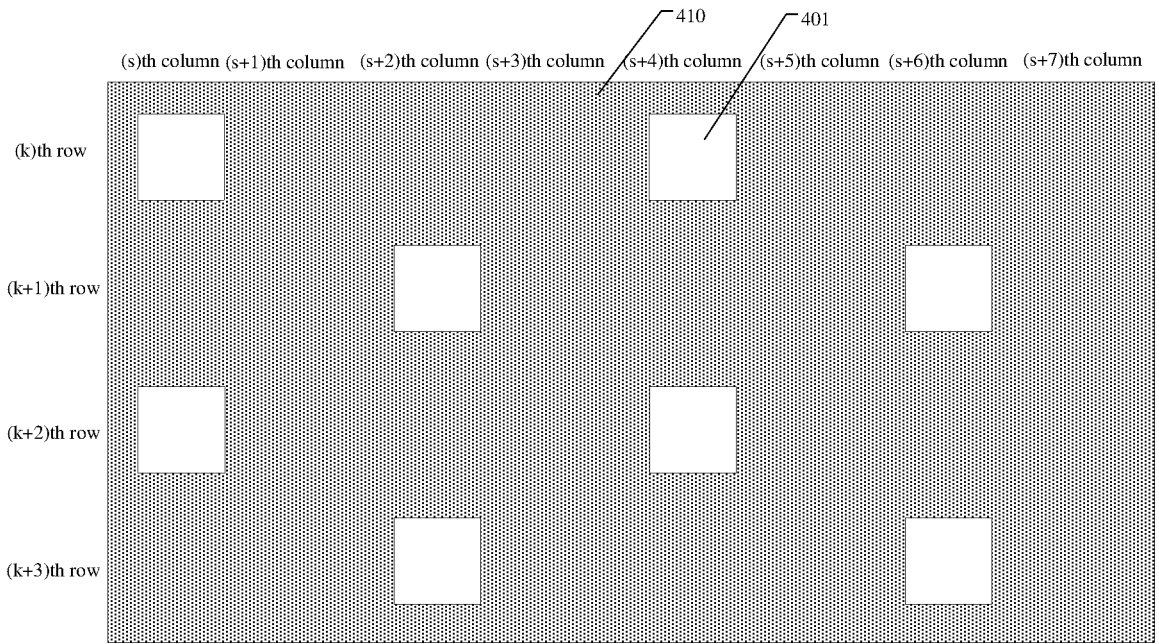
FIG. 13A is a schematic structural diagram of a mask in a mask component provided by some embodiments of the present disclosure.
Figure 13B:
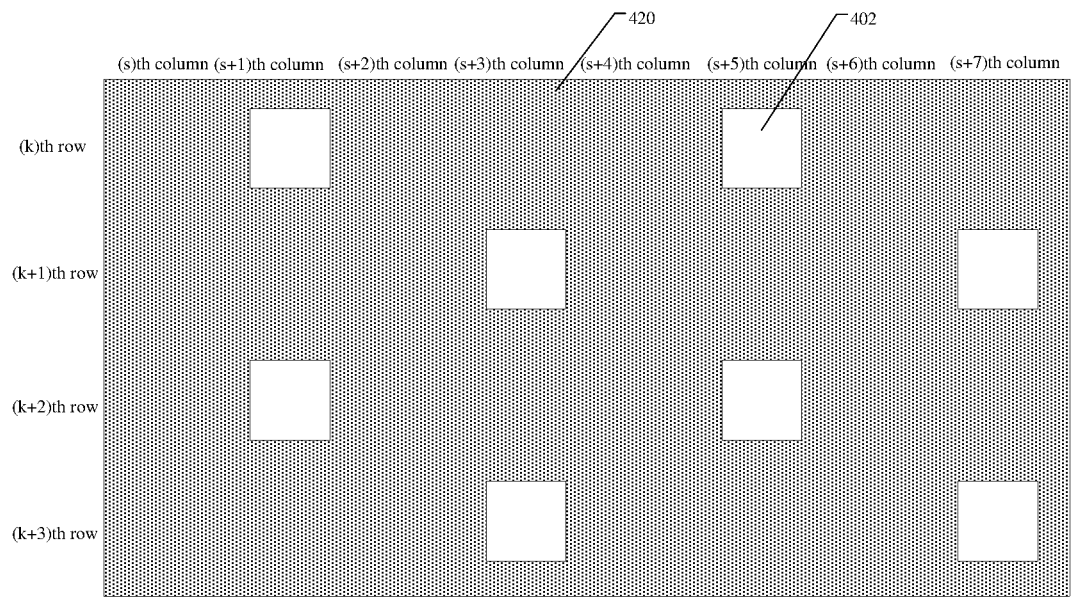
FIG. 13B is a schematic structural diagram of another mask in a mask component provided by some embodiments of the present disclosure.
Figure 13C:
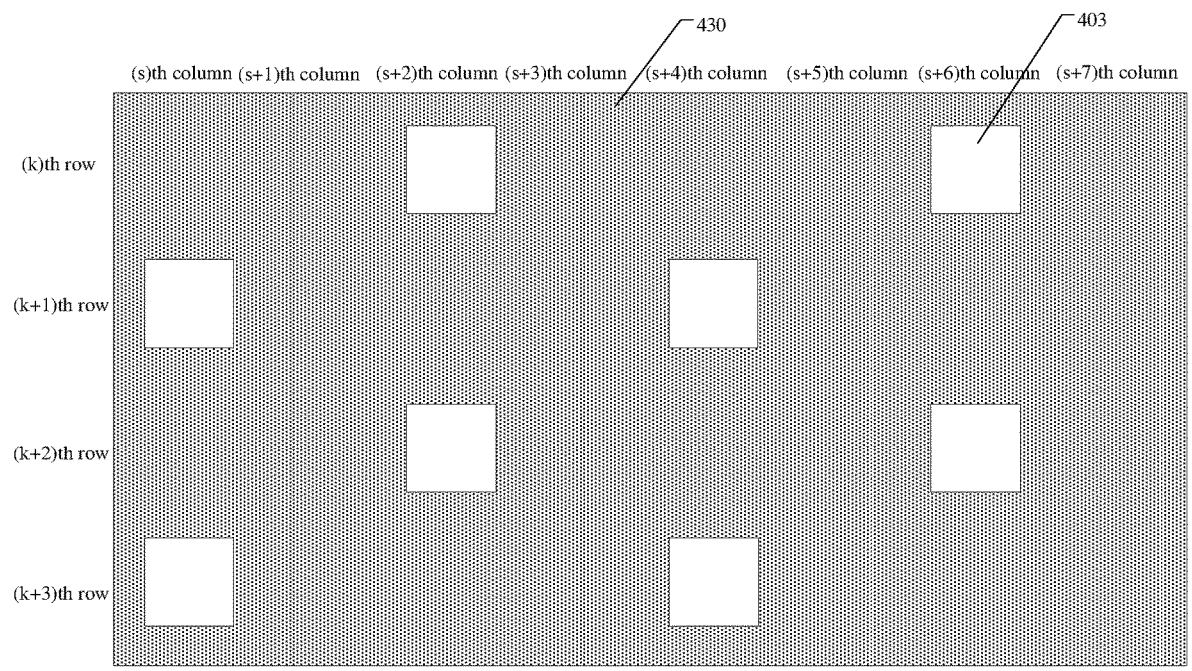
FIG. 13C is a schematic structural diagram of another mask in a mask component provided by some embodiments of the present disclosure.
Figure 13D:
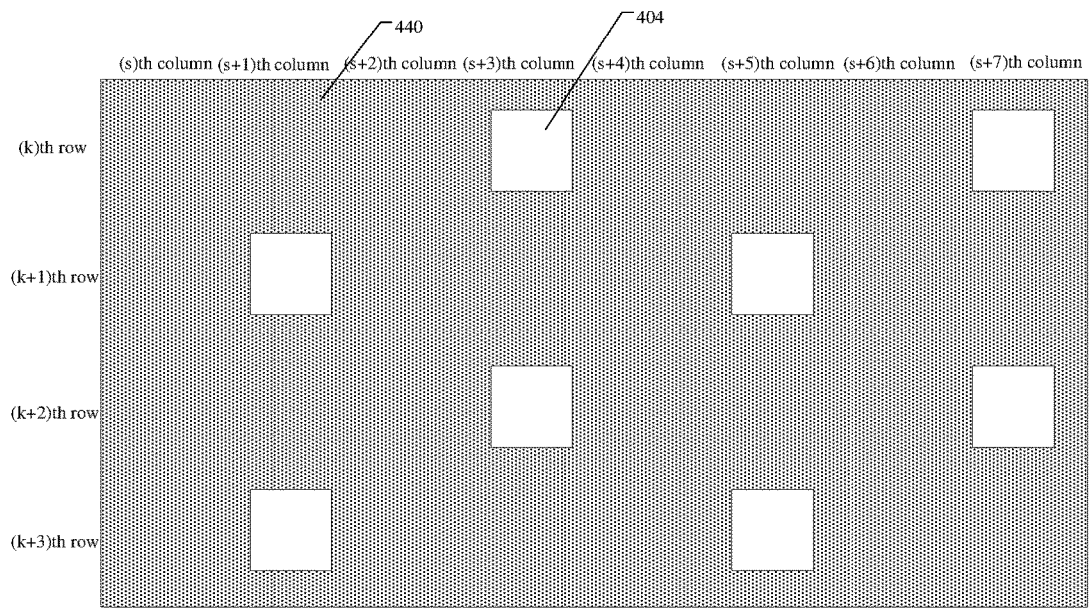
FIG. 13D is a schematic structural diagram of another mask in a mask component provided by some embodiments of the present disclosure.

Exemplarily, the mask component includes a first mask 410 as illustrated in FIG. 13A, a second mask 420 as illustrated in FIG. 13B, a third mask 430 as illustrated in FIG. 13C, and a fourth mask 440 as illustrated in FIG. 13D. The first mask 410 includes first openings 401, the second mask 420 includes second openings 402, the third mask 430 includes third openings 403, and the fourth mask 440 includes fourth openings 404. During the evaporation, the first openings 401, the second openings 402, the third openings 403 and the fourth openings 404 are used in the evaporation process to evaporate the light emitting layers of the first sub-pixel groups 110a, the second sub-pixel groups 120a, the third sub-pixel groups 130a and the fourth sub-pixel groups 140a of the pixel arrangement structure illustrated in FIG. 12, respectively. Exemplarily, as illustrated in FIG. 13A, FIG. 13B, FIG. 13C, and FIG. 13D, during the evaporation, the (s)th column of the mask corresponds to the (j)th column of the pixel arrangement structure, the (k)th row of the mask corresponds to the (i)th row of the pixel arrangement structure, and both s and k are positive integers.

For example, in at least one embodiment of the present disclosure, in a case where the evaporation is performed by using the mask component described above, the order of usage of the first mask 410, the second mask 420, the third mask 430 and the fourth mask 440 is not limited. For example, the film layers (for example, the light emitting layers) in the first sub-pixel group 110a, the second sub-pixel group 120a, the third sub-pixel group 130a and the fourth sub-pixel group 140a may be evaporated in sequence by using the first mask 410, the second mask 420, the third mask 430 and the fourth mask 440, respectively.

At least one embodiment of the present disclosure provides an evaporation apparatus, which includes the mask component according to any one of the embodiments described above.

Figure 14:
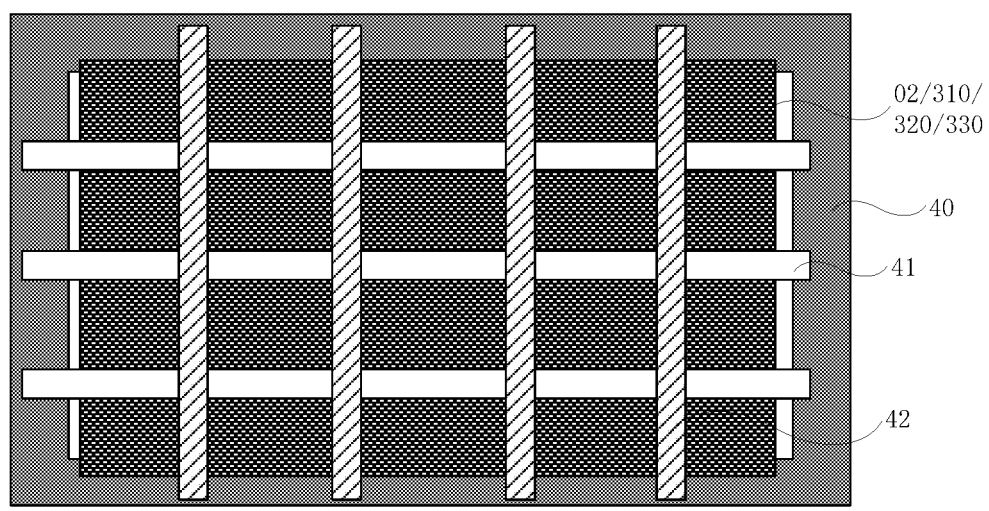
FIG. 14 is a schematic structural diagram of a mask integrated frame provided by some embodiments of the present disclosure.

For example, in at least one embodiment of the present disclosure, as illustrated in FIG. 14, the evaporation apparatus may further include a mask frame 40, a plurality of cover masks 41, and a plurality of howling masks 42. The cover masks 41 and the howling masks 42 described above are configured to shield the openings 30, corresponding to the region between two adjacent display panels in a mother board, on the mask 02, thereby avoiding panel pollution or material waste due to the evaporation material being evaporated on the region between the two adjacent display panels located in the mother board.

In this case, one mask 02 (or any one of the first mask 310, the second mask 320 and the third mask 330) in the mask component described above is fixedly mounted on the mask frame 40. The cover masks 41 and the howling masks 42, which cross each other, are laterally and vertically mounted on the mask frame 40. For example, one of the masks 02, the cover masks 41, and the howling masks 42 may be soldered on the mask frame 40 by a soldering process, thereby forming a mask frame assembly (MFA), and the MFA is placed in an evaporation chamber of the evaporation apparatus to evaporate the position to be evaporated of each of the display panels on the mother board to be evaporated (for example, an OLED display substrate).

For example, in at least one embodiment of the present disclosure, an align mask may be soldered on the MFA, which is used for improving the alignment accuracy of the mask 02 and the display panel, so as to improve the evaporation precision.

At least one embodiment of the present disclosure provides a method of forming a pixel arrangement structure, and the pixel arrangement structure (the film layer to be evaporated is, for example, the light emitting layer) is formed by using the mask component in the embodiments described above. In the method, by adopting the pixel arrangement structure, the plurality of sub-pixels in a same sub-pixel group may be formed by one opening of the mask, and the opening may have a greater design size, thereby lowering the requirement for the size of the opening of the mask (the opening doesn't need to be very small), lowering the requirement for the apparatus used in the manufacturing process, and lowering costs. In addition, while the requirement for the size of the opening of the mask is lowered, a plurality of sub-pixels can further be manufactured through one opening of the mask, thereby increasing the count of the sub-pixels, and improving the resolution of the display panel. It should be noted that, during the evaporation, the correspondence relationship between the pixel arrangement structure and the structure of corresponding mask component, and the correspondence relationship between the mask component (or the mask therein) and the pixel arrangement structure (or the sub-pixel groups therein) may be referred to the related description in the embodiments described above, which are not repeated herein.

It should be noted that the above-mentioned evaporation apparatus has the same technical effects as the mask component according to the above-mentioned embodiments, which are not repeated herein.

Regarding the present disclosure, the following statements should be noted.

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or an area may be enlarged or narrowed, that is, the drawings are not drawn in a real scale.

(3) In case of no conflict, features in one embodiment or in different embodiments can be combined to obtain new embodiments.

What are described above is related to the specific embodiments of the present disclosure only. However, the protection scope of the present disclosure is not limited thereto. The protection scope of the present disclosure should be subject to the protection scope defined by the claims.

What is claimed is:

1. A pixel arrangement structure, comprising:
a plurality of sub-pixels, arranged in a row direction and a column direction,
wherein the plurality of sub-pixels are divided into a plurality of rows of sub-pixel groups, each of rows of sub-pixel groups comprise at least two rows of the sub-pixels, and comprise a plurality of repeating units arranged in sequence, and each of the repeating units comprises at least two sub-pixel groups of different colors,
each of the sub-pixel groups comprises at least two sub-pixels of a same color that are located in at least two rows and are adjacently arranged, and
sub-pixels adjacent to each other and having different colors, which are located in sub-pixel groups of different colors, constitute one pixel,
wherein each of the repeating units comprises sub-pixels groups of three different colors, and comprises two sub-pixel groups of each color of the three different colors, adjacent sub-pixel groups have different colors, and a same sub-pixel group comprises three of the sub-pixels,
centroids of the sub-pixels in each of the sub-pixel groups are configured to be linked to constitute a first virtual triangle, three sub-pixels of different colors which belong to different sub-pixel groups and are adjacent to each other constitute one pixel, and
the sub-pixel groups are arranged in one row, and two of the sub-pixel groups, between which two of the sub-pixel groups are arranged, have a same color,
wherein, in sub-pixel groups in a same row, arrangements of sub-pixels in adjacent sub-pixel groups are different,
in the sub-pixel groups in the same row, vertex angles of first virtual triangles in two adjacent sub-pixel groups of different colors have opposite directions.

2. The pixel arrangement structure according to claim 1, wherein the sub-pixels in each of the sub-pixel groups are arranged in two rows, and the sub-pixels comprised in the pixel are arranged in two rows.

3. The pixel arrangement structure according to claim 1, wherein an arrangement of repeating units of sub-pixel groups in odd-numbered rows is identical, and an arrangement of repeating units of sub-pixel groups in even-numbered rows is staggered by at least one of the sub-pixel groups in the row direction, relative to an arrangement of repeating units of sub-pixel groups in adjacent odd-numbered rows.

4. The pixel arrangement structure according to claim 1, wherein, in the sub-pixel groups in the same row, vertex angles of first virtual triangles in two of the sub-pixel groups of a same color have opposite directions; and in sub-pixel groups, in a same column, of a same color, vertex angles of first virtual triangles in two adjacent sub-pixel groups have a same direction.

5. The pixel arrangement structure according to claim 4, wherein a repeating unit comprises a first sub-pixel group, a second sub-pixel group, and a third sub-pixel group, which are of different colors, an arrangement order of a first sub-pixel group, a second sub-pixel and a third sub-pixel group in sub-pixel groups in an (i)th row is same with an arrangement order of a first sub-pixel group, a second sub-pixel and a third sub-pixel group in sub-pixel groups in a (i+2)th row;

an arrangement position of the first sub-pixel group in the (i)th row and an arrangement position of the first sub-pixel group in the (i+2)th row are staggered, and one column of second sub-pixel groups and one column of third sub-pixel groups are arranged between two adjacent columns of first sub-pixel groups; and i is a positive integer.

6. The pixel arrangement structure according to claim 1, wherein, in a same pixel, centroids of three different sub-pixels are configured to be linked to constitute a second virtual triangle.

7. The pixel arrangement structure according to claim 6, wherein, in pixels in a same row, vertex angles of second virtual triangles in two adjacent pixels have opposite directions; and in pixels in a same column, vertex angles of second virtual triangles in any two of the pixels have a same direction.

8. The pixel arrangement structure according to claim 1, wherein a planar shape of a sub-pixel is one or a combination of a circle, a triangle, a rectangle, and a polygon.

9. The pixel arrangement structure according to claim 8, wherein the planar shape of the sub-pixel is a regular hexagon or a square.

10. A display panel, comprising the pixel arrangement structure according to claim 1.

11. A mask component for manufacturing the pixel arrangement structure according to claim 1, comprising:

at least one mask, provided with a plurality of openings, wherein, during evaporation, each of the openings corresponds to one of the sub-pixel groups, and a region where an opening is located covers a region where a sub-pixel group corresponding to the opening is located.

12. The mask component according to claim 11, wherein all of the openings on the mask correspond to sub-pixel groups of a same color.

13. An evaporation apparatus, comprising the mask component according to claim 11.

14. The evaporation apparatus according to claim 13, further comprising a mask frame, a plurality of cover masks, and a plurality of howling masks, wherein the cover masks and the howling masks are configured to shield openings on the mask corresponding to a region between two adjacent display panels in a mother board to be evaporated; and one mask in the mask component is fixedly mounted on the mask frame, and the cover masks and the howling masks, which cross each other, are laterally and vertically mounted on the mask frame.

* * * * *